(12) United States Patent
Son

(10) Patent No.: US 12,315,549 B2
(45) Date of Patent: May 27, 2025

(54) SEMICONDUCTOR MEMORY DEVICE FOR PERFORMING REMAINING BANK REFRESH OPERATION AND REFRESH METHOD THEREOF

(71) Applicant: Samsung Electronics Co., Ltd., Suwon-si (KR)

(72) Inventor: Jongpil Son, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 148 days.

(21) Appl. No.: 18/295,285

(22) Filed: Apr. 4, 2023

(65) Prior Publication Data

US 2024/0135982 A1 Apr. 25, 2024
US 2024/0233802 A9 Jul. 11, 2024

(30) Foreign Application Priority Data

Oct. 25, 2022 (KR) ........................ 10-2022-0138466

(51) Int. Cl.
*G11C 11/00* (2006.01)
*G11C 11/406* (2006.01)
*G11C 11/408* (2006.01)

(52) U.S. Cl.
CPC .. *G11C 11/40618* (2013.01); *G11C 11/40615* (2013.01); *G11C 11/4087* (2013.01)

(58) Field of Classification Search
CPC ......... G11C 11/40603; G11C 11/40611; G11C 11/40618; G11C 11/40615; G11C 11/4087; G11C 11/406; G11C 11/4096; G11C 11/4076; G11C 11/4094; G11C 7/1027; G11C 8/12; G06F 12/00

USPC ........................................................ 365/222
See application file for complete search history.

(56) References Cited

U.S. PATENT DOCUMENTS

| | | | |
|---|---|---|---|
| 6,654,303 B2 | 11/2003 | Miyamoto et al. | |
| 7,263,021 B2 | 8/2007 | Lee | |
| 7,392,339 B2* | 6/2008 | David | G11C 11/4094 |
| | | | 711/106 |
| 7,583,552 B2 | 9/2009 | Remaklus et al. | |
| 7,844,773 B2 | 11/2010 | Sunwoo et al. | |
| 10,504,579 B2 | 12/2019 | Bains | |

FOREIGN PATENT DOCUMENTS

| | | |
|---|---|---|
| KR | 970067350 A | 10/1997 |
| KR | 1020060020871 A | 3/2006 |
| KR | 1020060091726 A | 8/2006 |
| KR | 100809960 B1 | 3/2008 |

* cited by examiner

*Primary Examiner* — Thong Q Le
(74) *Attorney, Agent, or Firm* — Myers Bigel, P.A.

(57) ABSTRACT

Disclosed is a semiconductor memory device that includes a memory cell array including a plurality of memory banks, a command decoder configured to decode a per-bank refresh command and a remaining bank refresh command received from an external source, and a refresh controller configured to control the cell array to perform a per-bank refresh operation for refreshing one memory bank among the plurality of memory banks that is based on a decoding result of the per-bank refresh command of the command decoder, wherein the refresh controller is configured to perform a remaining bank refresh operation for refreshing remaining memory banks other than the one memory bank among the plurality of memory banks, in response to the remaining bank refresh command during one refresh cycle.

20 Claims, 14 Drawing Sheets

FIG. 3

| | Bank 1 | Bank 2 | Bank 3 | Bank 4 | Bank 5 | Bank 6 | Bank 7 | Bank 8 | Bank 9 | Bank 10 | Bank 11 | Bank 12 | Bank 13 | Bank 14 | Bank 15 | Bank 16 |
|---|---|---|---|---|---|---|---|---|---|---|---|---|---|---|---|---|
| PBR#1 | O | | | | | | | | | | | | | | | |
| PBR#2 | | | | | | O | | | | | | | | | | |
| RBR | | O | O | O | O | | O | O | O | O | O | O | O | O | O | O |

1155

SEMICONDUCTOR MEMORY DEVICE FOR PERFORMING REMAINING BANK REFRESH OPERATION AND REFRESH METHOD THEREOF

CROSS-REFERENCE TO RELATED APPLICATION

This application claims priority under 35 U.S.C. § 119 to Korean Patent Application No. 10-2022-0138466 filed on Oct. 25, 2022, in the Korean Intellectual Property Office, the disclosures of which are incorporated by reference herein in its entirety.

BACKGROUND

Embodiments of the present disclosure described herein relate to a semiconductor memory device, and more particularly, to a semiconductor memory device that performs a remaining bank refresh operation capable of increasing command bandwidth and a refresh method thereof.

As an example of a semiconductor memory device, a dynamic random access memory DRAM device, which is a volatile-memory, stores data by charge stored in a capacitor. Because the charge stored in the capacitor may leak through various paths over time, the DRAM has a finite data retention characteristic. DRAM requires a refresh operation to periodically rewrite data stored in a capacitor to solve finite data retention.

In general, the DRAM does not receive a write or read command to prevent data collision during an all-bank refresh operation for refreshing all memory banks. However, during a per-bank refresh PBR operation for refreshing some banks, access to banks that are not refresh targets is possible. The DRAM refresh operation is managed by a host, such as a memory controller.

As memory modules and memory devices evolve to have higher capacities and higher integration, control of a DRAM refresh operation by a host is becoming increasingly complex. For example, for a per-bank refresh PBR operation, the memory controller schedules commands for each of the banks. However, as the number of banks increases, a burden of frequently issuing a per-bank refresh PBR command arises. In addition, when the number of refresh commands increases, the DRAM may not receive write or read commands with respect to the rows being refreshed based on the refresh commands, so the bandwidth of the command channel decreases and performance may degrade. Therefore, there is an urgent need for a technology capable of reducing DRAM performance degradation by securing command bandwidth even when the number of banks increases.

SUMMARY

Embodiments of the present disclosure provide a semiconductor memory device capable of increasing command bandwidth by reducing the number of refresh commands and a refresh method thereof.

According to an embodiment, a semiconductor memory device, comprising, a cell array including a plurality of memory banks, a command decoder configured to decode a per-bank refresh command and a remaining bank refresh command received from an external source, and a refresh controller configured to control the cell array to perform a per-bank refresh operation for refreshing one memory bank among the plurality of memory banks that is selected based on a decoding result of the per-bank refresh command of the command decoder, wherein the refresh controller is configured to perform a remaining bank refresh operation for refreshing all memory banks other than the one memory bank among the plurality of memory banks, which remains after the per-bank refresh operation, in response to the remaining bank refresh command during one refresh cycle.

According to an embodiment, a refresh method of a semiconductor memory device including a plurality of memory banks, refreshing a selected one of the plurality of memory banks in response to a per-bank refresh command, and refreshing in parallel remaining memory banks other than a refreshed memory bank including the selected one memory bank among the plurality of memory banks in response to a remaining bank refresh command.

According to an embodiment, a semiconductor comprising, a plurality of memory banks, a command decoder configured to decode an all-bank refresh command, a per-bank refresh command, and a remaining bank refresh command, an address decoder configured to receive an input address, a refresh controller configured to perform a per-bank refresh operation for refreshing one selected memory bank among the plurality of memory banks in response to the per-bank refresh command during one refresh cycle, and a remaining bank refresh operation for refreshing in parallel remaining memory banks remaining after the per-bank refresh operation among the plurality of memory banks in response to the remaining bank refresh command, and a refresh status register configured to update a refresh status of each of the plurality of memory banks during the one refresh cycle.

BRIEF DESCRIPTION OF THE DRAWINGS

The above and other objects and features of the present disclosure will become apparent by describing in detail embodiments thereof with reference to the accompanying drawings.

FIG. 3 is a table showing issue states of refresh commands for each bank stored in the command status register of FIG. 2.

DETAILED DESCRIPTION

Figure 1:
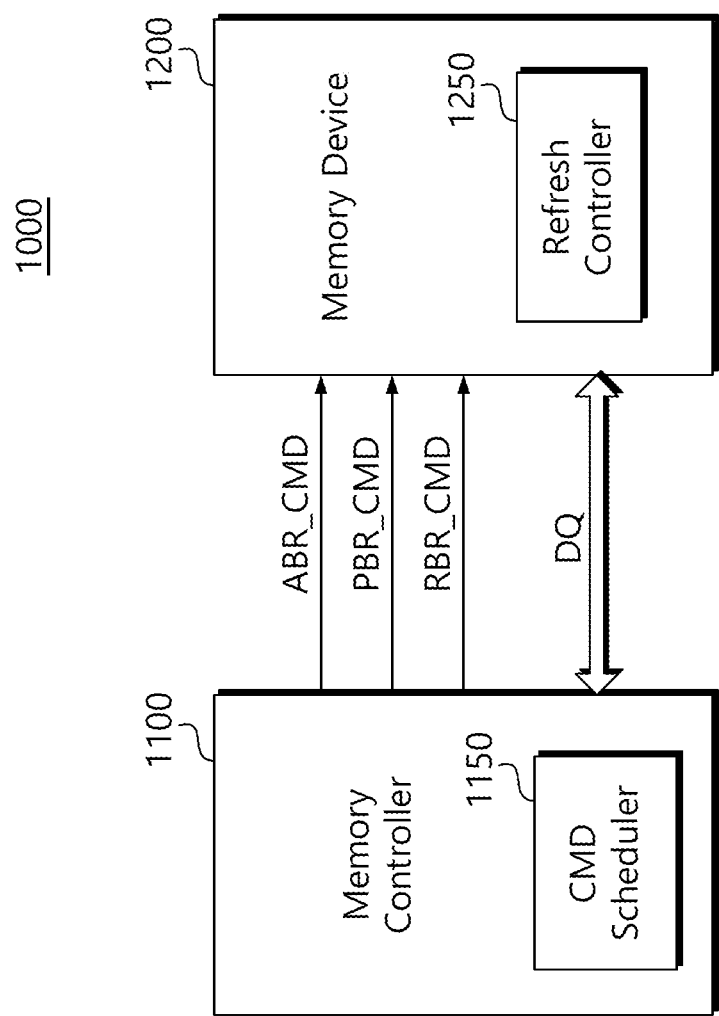
FIG. 1 is a block diagram illustrating a memory system including a memory device according to an example embodiment of the inventive concept.

It is to be understood that both the foregoing general description and the following detailed description are examples. The same reference numerals are used for the same components in the drawings, and redundant descriptions thereof are omitted. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination.

Hereinafter, DRAM will be used as an example of a semiconductor memory device for describing the features and functions of embodiments of the inventive concept. However, those skilled in the art will readily appreciate other advantages and capabilities of the inventive concept in light of the disclosure herein. Embodiments of the inventive concept may be implemented or applied through other implementations. In addition, the detailed description may be modified or changed according to viewpoints and applications without significantly departing from the scope, spirit, and other objectives of embodiments of the inventive concept.

In addition, a 'refresh cycle' may refer to an operation cycle for refreshing one row selected for all memory banks. When one refresh cycle is completed, the refresh row address counts up and the subsequent refresh cycle is performed on the next row.

FIG. 1 is a block diagram illustrating a memory system including a memory device according to an example embodiment of the inventive concept. Referring to FIG. 1, a memory system 1000 according to an embodiment of the inventive concept may include a memory controller 1100 and a memory device 1200.

The memory controller 1100 may be configured to perform an access operation of writing data to the memory device 1200 or reading data stored in the memory device 1200.

The memory controller 1100 may be configured to generate a command CMD and an address for writing data into the memory device 1200 or reading data stored in the memory device 1200. The memory controller 1100 may be a memory controller for controlling the memory device 1200, a system on chip (SoC) such as an application processor (AP), a CPU, and/or a GPU.

In particular, the memory controller 1100 may be configured to provide refresh commands (ABR_CMD, PBR_CMD, RBR_CMD) for controlling a refresh operation to the memory device 1200. The memory controller 1100 may include a command scheduler 1150 that is configured to perform scheduling of refresh commands or read/write commands provided in units of banks. The command scheduler 1150 is configured to monitor an issue state of a refresh command in each bank unit in the command queue. Also, the command scheduler 1150 may be configured to issue a per-bank refresh command PBR_CMD or a remaining bank refresh command RBR_CMD using the monitoring result.

Here, the all-bank refresh command ABR_CMD is a command for refreshing all banks for the selected cell-row. Therefore, because a refresh operation occurs in all memory banks, a read or write command cannot be provided to the memory banks being refreshed after the all-bank refresh command ABR_CMD is provided. On the other hand, the per-bank refresh command PBR_CMD is provided with an address designating one bank. Accordingly, during a per-bank refresh operation executed by the per-bank refresh command PBR_CMD, reading and writing operations on unselected banks are possible.

According to an embodiment, a remaining bank refresh command RBR_CMD may be a command for performing a simultaneous or parallel refresh operation on the remaining memory banks not including at least one bank on which a per-bank refresh is performed. That is, the remaining bank refresh RBR operation is an operation of simultaneously refreshing the remaining banks and/or refreshing the remaining banks in parallel after at least one per-bank refresh PBR is performed in a refresh cycle for a selected cell row.

As the number of memory banks increases, a plurality of per-bank refresh commands PBR_CMDs are required to apply per-bank refresh PBR to all memory banks within one refresh cycle. This may reduce the bandwidth of the command channel and cause performance degradation of the memory device 1200. Therefore, when an urgent read or write operation is required, the per-bank refresh command PBR_CMD is used, and then the remaining bank refresh command RBR_CMD is used to reduce the number of commands issued.

In particular, even during a refresh operation by the remaining bank refresh command RBR_CMD, reading/writing to the memory bank for which refresh is completed by the per-bank refresh command PBR_CMD is possible. Accordingly, access to some memory banks is possible even during a per-bank refresh PBR or remaining bank refresh RBR operation of the memory device 1200. Therefore, it is possible to sufficiently secure a bandwidth of the command channel, and thus, it is possible to reduce performance degradation due to a refresh operation.

The memory device 1200 is configured to output read data requested by the memory controller 1100 to the memory controller 1100 or to store data requested to be written by the memory controller 1100 in a memory cell. In particular, the memory device 1200 according to embodiments of the inventive concept may include a refresh controller 1250 that is configured to perform a remaining bank refresh RBR operation in response to a remaining bank refresh command RBR_CMD. That is, if the remaining bank refresh command RBR_CMD is provided while performing the per-bank refresh PBR in one refresh cycle, the memory device 1200 may perform a refresh operation on the remaining memory banks in parallel. The remaining bank refresh RBR operation is defined as an operation of refreshing the remaining banks in parallel after performing per-bank refresh PBR at least once in a refresh cycle for a selected cell row. Therefore, after the remaining bank refresh RBR operation, the count-up of the cell-row selected for refresh occurs.

Here, the memory device 1200 may be a high bandwidth memory (hereinafter referred to as HBM) or a next-generation DRAM (e.g., LPDDR6 or LPDDR7) that operates at ultra-speed. The memory device 1200 may be a semiconductor memory device in a system-in-package (SiP). In other embodiments, the memory device 1200 may include DDR Double Data Rate Synchronous Dynamic Random Access Memory (SDRAM), Low Power Double Data Rate (LPDDR) SDRAM, Graphics Double Data Rate (GDDR) SDRAM, and/or Rambus Dynamic Random Access Memory (RDRAM). The memory device 1200 may also be a volatile memory device, such as random access memory (SRAM). In other embodiments, the memory device 1200 may be a nonvolatile memory device such as a resistive RAM (RRAM), a phase change memory (PRAM), a magnetoresistive memory (MRAM), a ferroelectric memory (FRAM), a spin injection magnetization reversal memory (STT-RAM), and the like. In this specification, the advantages of embodiments of the inventive concept are described based on DRAM, but example embodiments of the inventive concept are not limited thereto.

As described above, according to the remaining bank refresh RBR operation performed in the memory device 1200 of the present disclosure, a reduction in bandwidth of the command channel due to the refresh operation can be reduced or minimized. Accordingly, when the memory device 1200 according to embodiments of the inventive concept is used in an application, the memory controller 1100 can sufficiently secure a command channel bandwidth, effectively reducing performance degradation due to a refresh operation.

Figure 2:
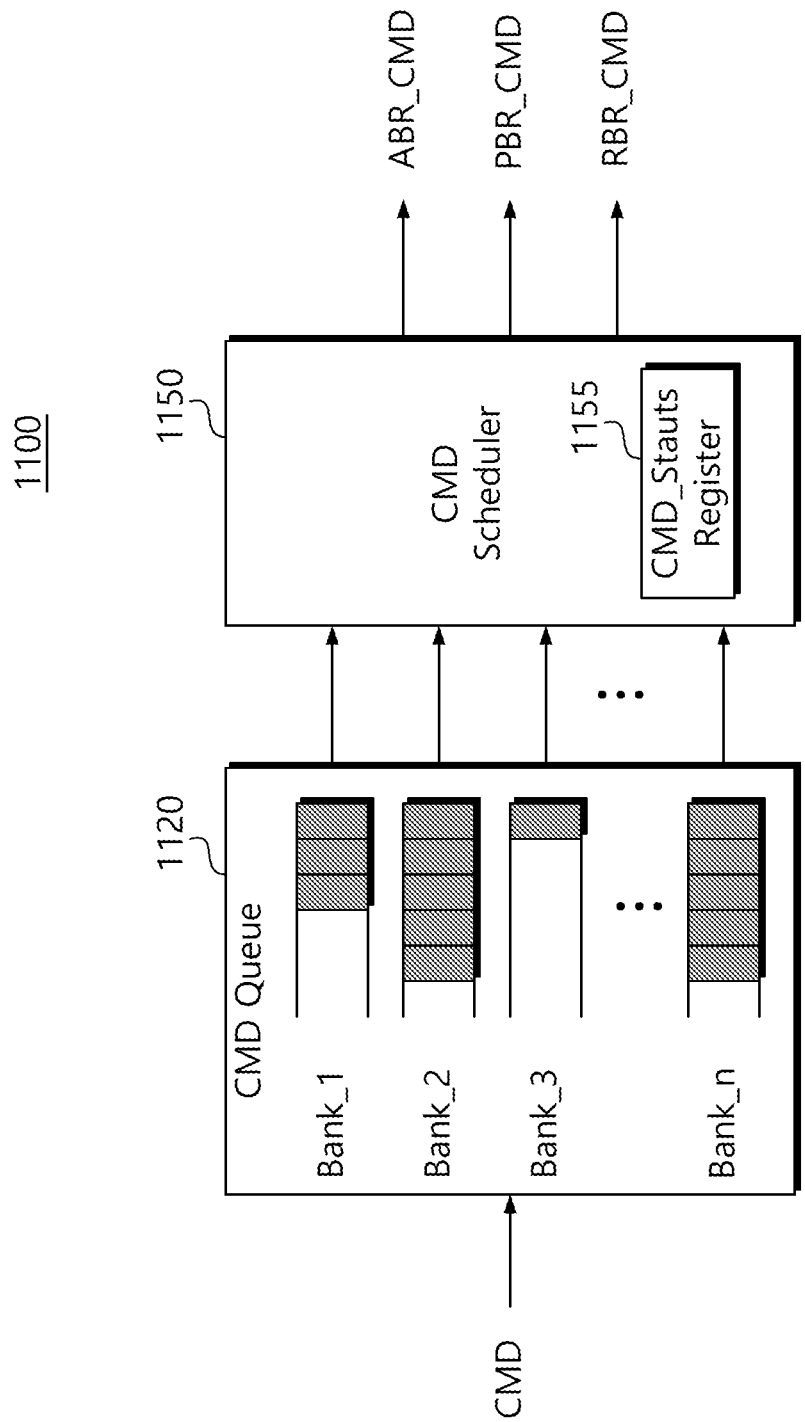
FIG. 2 is a block diagram showing a memory controller according to an example embodiment of the inventive concept.

FIG. 2 is a block diagram showing a memory controller according to an example embodiment of the inventive concept. Referring to FIG. 2, the memory controller 1100 may include a command queue 1120 and a command scheduler 1150.

Commands CMDs generated by the CPU or host are managed in the command queue 1120 in units of banks. The input command CMD is allocated to each of the banks Banki to Bank_n, and the allocated commands form a queue for each bank. For example, a read command RD_CMD for the first bank Banki and a per-bank refresh command PBR_CMD may sequentially form a queue. The command CMD input in this way may be assigned to each queue of the banks Banki to Bank_n in the command queue 1120.

The command scheduler 1150 is configured to generate a command based on a queue state of each bank formed in the command queue 1120. In particular, the command scheduler 1150 according to embodiments of the inventive concept may be configured to generate refresh commands ABR_CMD, PBR_CMD, and RBR_CMD by referring to the command queue 1120 for each of the banks. If reading or writing to the third bank Bank_3 is urgently requested, a per-bank refresh command PBR_CMD for a memory bank other than the third bank Bank_3 may be generated.

While a per-bank refresh operation for another memory bank is being performed, the command scheduler 1150 may issue a read or write command to the third bank Bank_3. Subsequently, when reading or writing to the third bank Bank_3 is completed and the per-bank refresh PBR operation is completed, the command scheduler 1150 issues a per-bank refresh command PBR_CMD for another bank or a remaining bank refresh command RBR_CMD can be issued.

During the remaining Bank Refresh RBR operation, the command scheduler 1150 may issue a read or write command for a memory bank for which the per-bank refresh PBR has been completed during a current refresh cycle. That is, the command scheduler 1150 may issue a command for access to a memory bank that is not a refresh target while performing a per-bank refresh PBR operation or a remaining bank refresh RBR operation. For the operation of the command scheduler 1150, the command scheduler 1150 may include a command status register 1155 indicating the issuance status of the refresh command for each bank.

The command status register 1155 is configured to store the per-bank issue status of a per-bank refresh command PBR_CMD and a remaining bank refresh command RBR_CMD during a refresh cycle. The command scheduler 1150 may determine an issuance state of a per-bank refresh command PBR_CMD or a remaining bank refresh command RBR_CMD within the refresh cycle referring to the command status register 1155. As described above, through the remaining bank refresh RBR operation, the command scheduler 1150 can significantly reduce the number of issued commands.

According to the characteristics of the memory controller 1100 described above, urgent read and write commands may be issued through use of the per-bank refresh command PBR_CMD in a refresh cycle. When the per-bank refresh operation is completed, the memory controller 1100 may issue a remaining bank refresh command RBR_CMD for refreshing the remaining memory banks in parallel corresponding to the selected cell-row. Through use of the remaining bank refresh command RBR_CMD, the memory controller 1100 may reduce the number of refresh commands that are issued. Accordingly, the memory controller 1100 can sufficiently secure a bandwidth of the command channel and reduce performance degradation due to refreshing operations.

FIG. 3 is a table showing issue states of refresh commands for each bank stored in the command status register of FIG. 2. Referring to FIG. 3, a per-bank refresh command PBR_CMD issued in one refresh cycle may be stored in the command status register 1155. Here, for convenience of description, it is assumed that the number of banks of the memory device 1200 is 16.

When the refresh cycle begins, the command scheduler 1150 issues the first per-bank refresh command (PBR #1) for the sixth bank (Bank 6) address. Then, the memory device 1200 will perform a refresh operation on the selected cell-row of the sixth bank (Bank 6). Next, command scheduler 1150 issues a second per-bank refresh command (PBR #2) for the first bank (Bank 1) address. The memory device 1200 may perform a refresh operation on the selected cell-row of the first bank (Bank 1).

After the per-bank refresh commands PBR #1 and PBR #2 are issued, the command scheduler 1150 may issue access commands for the remaining banks (Bank 2 to Bank 5 and Bank 7 to Bank 16). For example, while the memory device 1200 performs a refresh operation in response to the per-bank refresh command PBR #1, the memory controller 1100 may issue a read or write command for any one of the remaining banks (Bank 1 to Bank 5 and Bank 7 to Bank 16). Also, read or write operations on the remaining banks (Bank 2 to Bank 16) are possible even when the per-bank refresh command PBR #2 designating Bank 1 to be refreshed is issued.

The command scheduler 1150 may issue the remaining bank refresh commands RBR_CMD when there is no additional urgent read or write access request after issuing the per-bank refresh commands PBR #1 and PBR #2. Then, the memory device 1200 refreshes the remaining banks (Bank 2 to Bank 5, Bank 7 to Bank 16) except for the banks refreshed by the per-bank refresh commands PBR #1 and PBR #2. While the remaining bank refresh command RBR_CMD is provided and the memory device 1200 performs the remaining bank refresh RBR operation, the memory controller 1200 may issue read or write commands for banks (Bank 1 and Bank 6) that are not subject to refresh. When the remaining bank refresh RBR operation for the remaining banks (Bank 2 to Bank 5 and Bank 7 to Bank 16) is completed, the refresh cycle for the selected cell-row is completed.

Figure 4:
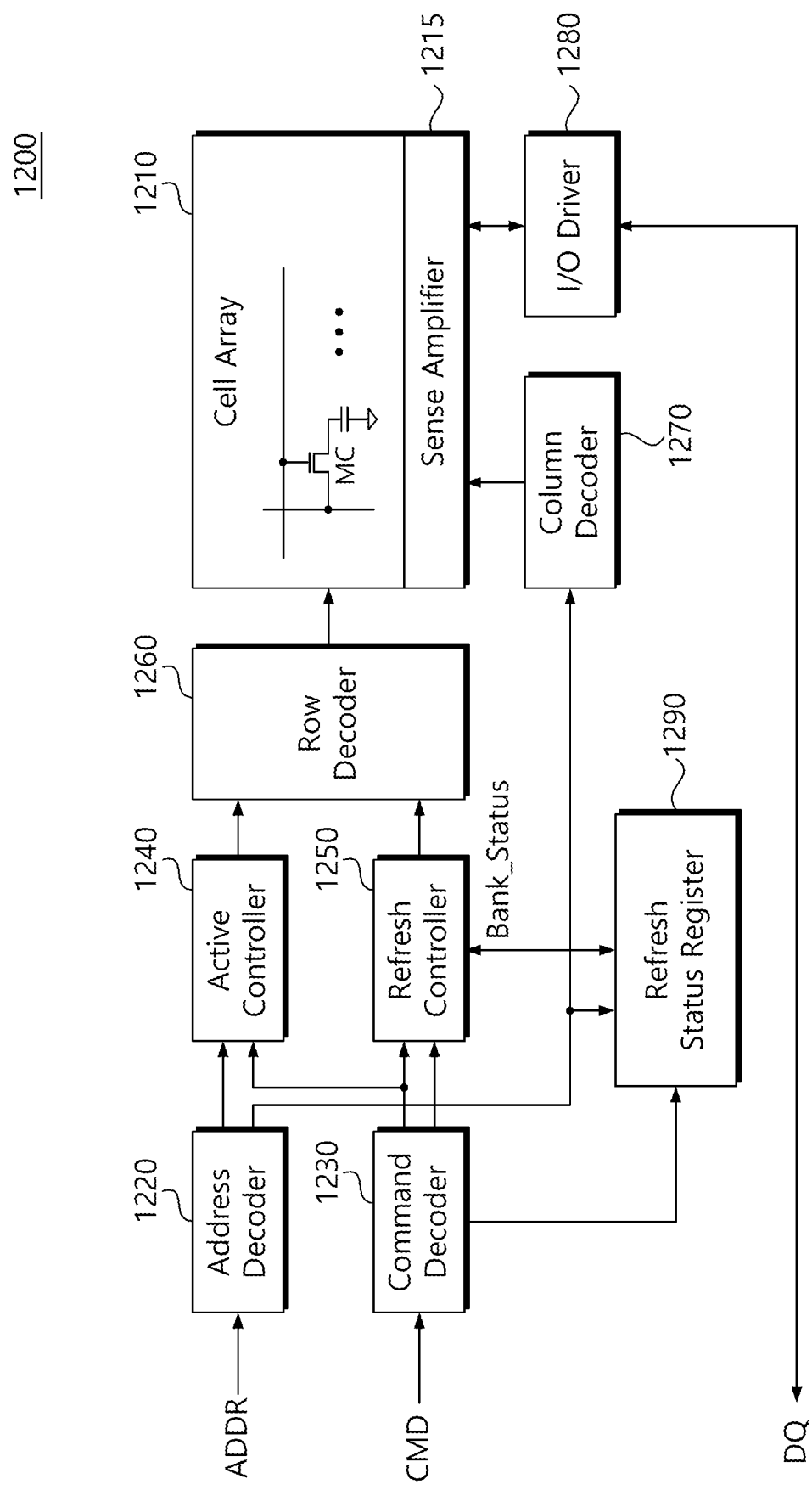
FIG. 4 is a block diagram illustrating a memory device according to an example embodiment of the inventive concept.

FIG. 4 is a block diagram illustrating a memory device according to an example embodiment of the inventive concept. Referring to FIG. 4, a memory device 1200 includes a cell array 1210, a sense amplifier 1215, an address decoder 1220, a command decoder 1230, an active controller 1240, a refresh controller 1250, and a row decoder 1260, a column decoder 1270, a data input/output driver 1280, and a refresh status register 1290.

The cell array 1210 may be configured to sense stored data and provide the sensed data to the data input/output driver 1280 through the sense amplifier 1215. In addition, the cell array 1210 may be configured to store write data received from the data input/output driver 1280 in memory cells of selected rows and columns through the sense amplifier 1215. At this time, the column decoder 1270 and the row decoder 1260 may provide the address ADDR for data to be input/output to the cell array 1210.

In particular, the cell array 1210 may include a plurality of banks. During a refresh cycle in which one cell-row is selected, a plurality of banks may be refreshed by one or more per-bank refresh PBR operations and/or a remaining bank refresh RBR operation. That is, if the remaining bank refresh command RBR_CMD is provided while performing a per-bank refresh PBR operation in one refresh cycle, the remaining memory banks may be refreshed all together. After the remaining bank refresh RBR operation, the cell-row selected for refresh is counted up, followed by a subsequent refresh cycle.

The address decoder 1220 is configured to receive an address of a memory cell to be accessed through the address ADDR. When data is stored in the memory cell or data is read from the memory cell, the address ADDR may be transmitted to the cell array 1210 through the address decoder 1220, the active controller 1240, the refresh controller 1250, the row decoder 1260, and the column decoder 1270. In particular, during the per-bank refresh PBR operation according to embodiments of the inventive concept, the corresponding bank address will be provided to the address decoder 1220. In addition, for the Remaining Bank Refresh RBR operation, the remaining banks may be selected for refresh without a separate address input.

Command decoder 1230 receives various commands. The command decoder 1230 is configured to decode and to provide commands to circuit blocks, such as the column decoder 1270, the active controller 1240, and the refresh controller 1250. The command decoder 1230 may be configured to determine an input command by referring to externally applied signals (/RAC,/CAS,/WE). Furthermore, the command decoder 1230 may write data into a mode register set (MRS, not shown) according to an externally provided command and address. For example, a general auto refresh operation may be input through a combination of control signals (/RAS,/CAS,/WE). Then, the refresh operation is determined by the command decoder 1230, and the refresh command is provided to the refresh controller 1250 by the mode register set MRS.

The active controller 1240 is configured to generate an active address and an active signal according to a write or read operation based on the address ADDR and command CMD provided from the address decoder 1220 and the command decoder 1230, and is configured to provide them to the row decoder 1260.

When the refresh commands ABR_CMD, PBR_CMD, and RBR_CMD are input to the memory device 1200, the refresh controller 1250 is configured to perform a refresh operation corresponding to the commands that are input. When the all-bank refresh command ABR_CMD is received, the refresh controller 1250 is configured to refresh all memory banks corresponding to the selected cell-row. When the per-bank refresh command PBR_CMD is received, the refresh controller 1250 is configured to perform a refresh operation on a bank selected from among a plurality of memory banks through a bank address. In addition, if the remaining bank refresh command RBR_CMD is received before the refresh cycle ends, the refresh controller 1250 is configured to perform the refresh operation on the non-refreshed banks among the memory banks. This operation is referred to above as a remaining bank refresh RBR operation.

The refresh controller 1250 is configured to refer to the bank status (Bank_Status) stored in the refresh status register 1290 for the remaining bank refresh RBR operation. The refresh controller 1250 is configured to obtain the address of the remaining bank(s) from the refresh status register 1290 when the remaining bank refresh command RBR_CMD is received before the refresh cycle ends. Here, the remaining banks refer to memory banks that have not already been refreshed by a per-bank refresh PBR operation in a corresponding refresh cycle. The refresh controller 1250 is configured to perform the remaining bank refresh RBR operation for refreshing all the remaining banks in response to the remaining bank refresh command RBR_CMD. Then, the refresh controller 1250 counts up or increments the address of the cell-row.

The row decoder 1260 is configured to control the operation of the cell array 1210 through the provided active address, active signal, refresh active signal, and refresh address. During the refresh cycle, the row decoder 1260 is configured to activate the cell-row selected by the refresh controller 1250. The row decoder 1260 is configured to activate the cell-row of the selected bank during the refresh cycle. Also, if a read or write request occurs during a per-bank refresh PBR operation or a remaining bank refresh RBR operation, the row decoder 1260 may select rows of banks excluded from refresh.

The data input/output driver 1280 may be configured to receive data provided through the data pad DQ and provide the received data to the sense amplifier 1215. The data input/output driver 1280 may be configured to output data stored in the cell array 1210 through the data pad DQ. Although not shown, the data input/output driver 1280 may receive a data strobe signal through the data strobe pad DQS when data is received. Also, when outputting data, the data input/output driver 1280 may output a data strobe signal through the data strobe pad DQS.

The refresh status register 1290 is configured to update the bank status Bank_Status by monitoring an inputted refresh command and a refresh address. For example, the refresh status register 1290 is configured to monitor refresh commands PBR_CMD and RBR_CMD input to the memory device 1200 and to store the refresh status for each bank. A refresh status indicated by logic level high and low may be stored in the refresh status register 1290. For example, memory banks refreshed by the per-bank refresh command PBR_CMD in the refresh status register 1290 may be indicated as logic '1', and memory banks before being refreshed may be indicated as logic '0'. Also, at the time when the states of all banks are updated to logic '1', the logic value of the bank status Bank_Status of each of the banks may be reset to logic '0'.

An example structure of the memory device 1200 according to embodiments of the inventive concept has been described above. The memory device 1200 according to embodiments of the inventive concept may be configured to execute the remaining bank refresh command RBR_CMD provided from the outside (e.g., a memory controller). Accordingly, the bandwidth reduction of the command channel can be reduced compared to the case of using only the per-bank refresh command PBR_CMD. Here, when the memory device 1200 is a DRAM, the memory device 1200 is configured to operate in synchronization with a clock. Accordingly, configurations such as a clock buffer, a delay fixing circuit, and a duty correction circuit may be added. In the interest of brevity, however, a description thereof will be omitted.

Figure 5:
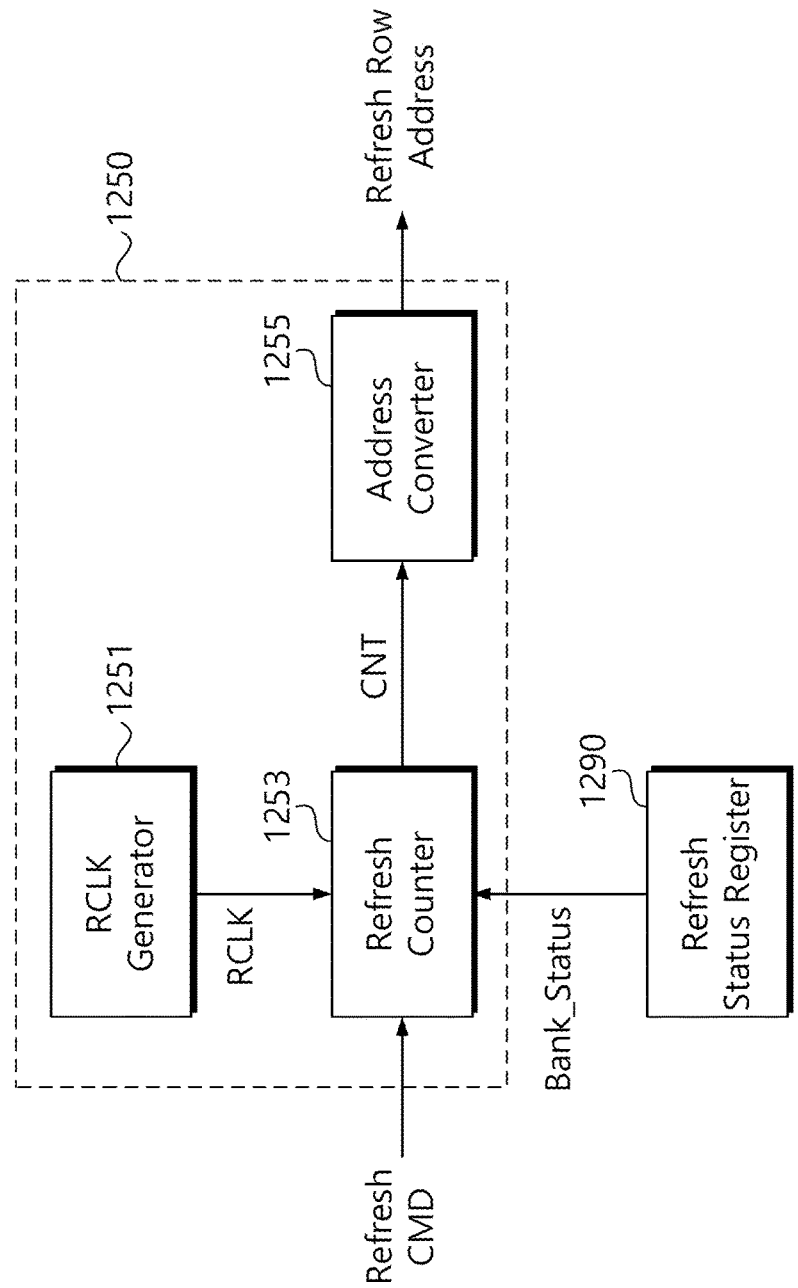
FIG. 5 is a block diagram briefly illustrating the configuration of the refresh controller according to an example embodiment of the inventive concept.

FIG. 5 is a block diagram briefly illustrating the configuration of the refresh controller according to embodiments of the inventive concept. Referring to FIG. 5, the refresh controller 1250 may include a refresh clock generator 1251, a refresh counter 1253, and an address converter 1255.

The refresh clock generator 1251 is configured to generate a refresh clock signal RCLK for a refresh operation. The refresh clock generator 1251 may include an oscillator, a phase locked loop PLL, and/or a delay locked loop DLL for generating the refresh clock signal RCLK.

The refresh counter 1253 is configured to perform a counting operation in response to a refresh command, a bank status Bank_Status, and a refresh clock signal RCK. The refresh counter 1253 may be configured to update the count value CNT according to the state of the refresh status register 1290 according to a per-bank refresh PBR operation or a remaining bank refresh RBR operation. Here, a count value CNT may indicate a number of refresh operations performed on each bank among the plurality of banks. For example, when a refresh operation is performed on one of the plurality of banks according to a per-bank refresh command, the refresh counter 1253 may increase a count value CNT corresponding to the one of the plurality of banks from 0 to 1. The count value CNT of the refresh counter 1253 increases according to the number of refresh cycles completed. Whether or not the refresh cycle is completed can be checked from the bank status Bank_Status provided from the refresh status register 1290. The refresh counter 1253 is configured to transfer the count value CNT to the address converter 1255. Then, the address converter 1255 will generate a refresh row address corresponding to the count value CNT.

Figure 6:
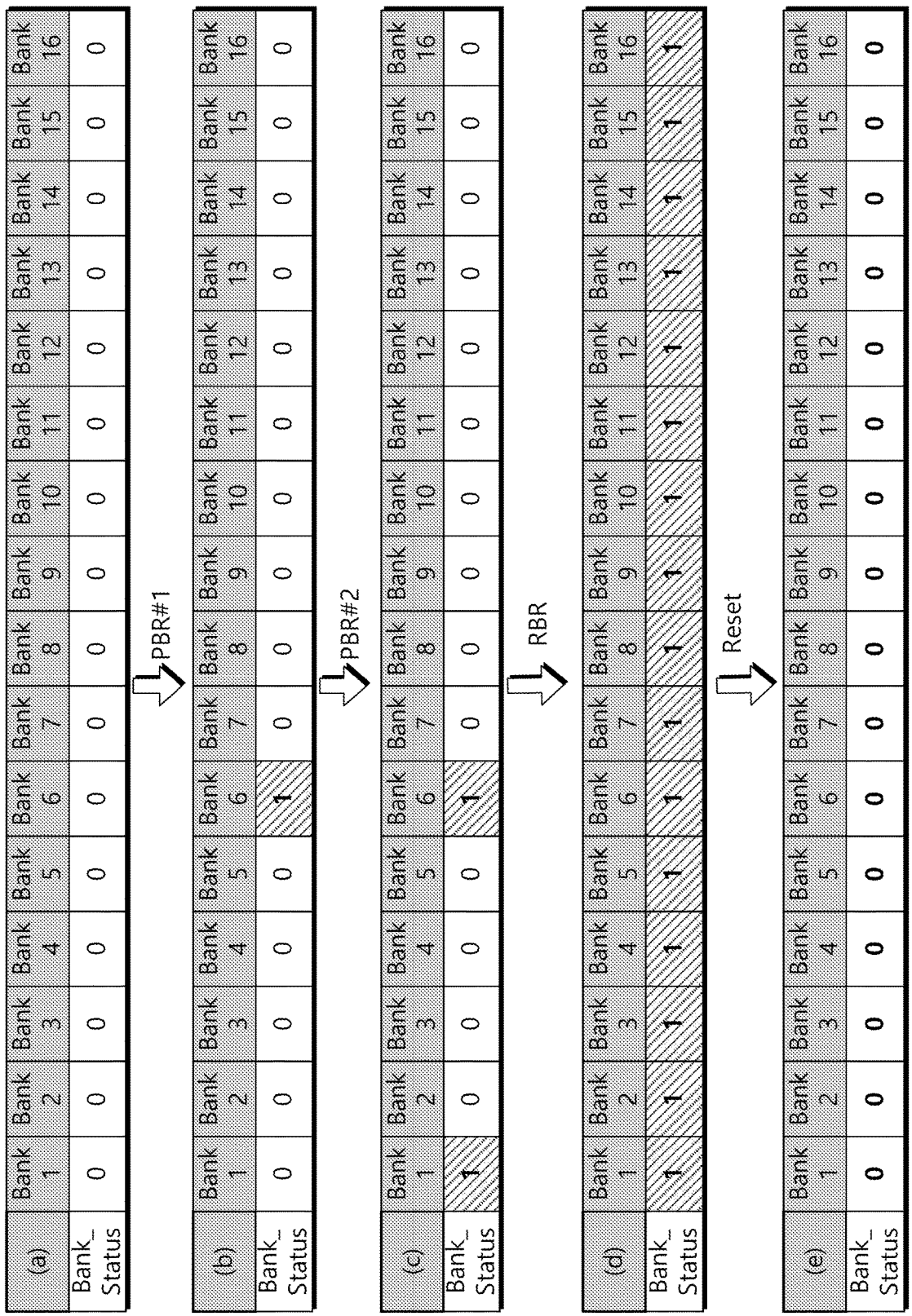
FIG. 6 is a table illustrating the bank status updated in the refresh status register of FIG. 5.

FIG. 6 is a table illustrating examples of the bank status Bank_Status updated in the refresh status register of FIG. 5. Referring to FIG. 6, the bank status Bank_Status may be updated or reset according to a per-bank refresh PBR operation or a remaining bank refresh RBR operation.

Table (a) shows the initial state of banks (Bank 1 to Bank 16) before the refresh operation for the selected cell-row starts. That is, the table (a) shows a state before an issue of the per-bank refresh command PBR_CMD or the remaining bank refresh command RBR_CMD for each of the banks Bank 1 to Bank 16 occurs. The refresh state of each of the banks (Bank 1 to Bank 16) is marked with logic '0'. This indicates that the refresh of each of the banks is not in progress.

In this state, a first per-bank refresh command PBR #1 for refreshing the sixth bank (Bank 6) may be transmitted. Then, the refresh controller 1250 (see FIG. 4) of the memory device 1200 performs a refresh operation on the sixth bank (Bank 6). In addition, the refresh status register 1290 updates the bank status of the sixth bank (Bank 6) to logic '1' in response to the first per-bank refresh command PBR #1. Table (b) shows the updated state of the bank of the sixth bank (Bank 6).

Subsequently, a second per-bank refresh command PBR #2 for refreshing the first bank (Bank 1) may be transmitted. Then, the refresh controller 1250 of the memory device 1200 will perform a refresh operation on the first bank (Bank 1). In addition, the refresh status register 1290 updates the bank status of the first bank (Bank 1) to logic '1' in response to the second per-bank refresh command PBR #2. Table (c) shows an updated state of the bank state of the first bank (Bank 1).

After the per-bank refresh PBR operation for the two banks (Bank 1 and Bank 6), the memory controller 1100 may issue a remaining bank refresh command RBR_CMD. Then, the refresh controller 1250 of the memory device 1200 performs a refresh operation on all the remaining banks in parallel (Bank 2 to Bank 5 and Bank 7 to Bank 16), that is, a remaining bank refresh RBR operation. And then, the refresh status register 1290 updates the bank status of each of the remaining banks (Bank 2 to Bank 5 and Bank 7 to Bank 16) to logic '1'. Table (d) shows that the bank states of all memory banks are updated to logic '1' according to the remaining bank refresh RBR operation.

When the bank status of all memory banks (Bank 1 to Bank 16) is updated to logic '1', the refresh status register 1290 resets the bank status of each of the memory banks (Bank 1 to Bank 16). Then, as shown in Table (e), the bank states of all memory banks are reset to logic '0'.

In the above, an example of updating the bank status of the refresh status register 1290 by the per-bank refresh command PBR_CMD and the remaining bank refresh command RBR_CMD has been briefly described.

Figure 7:
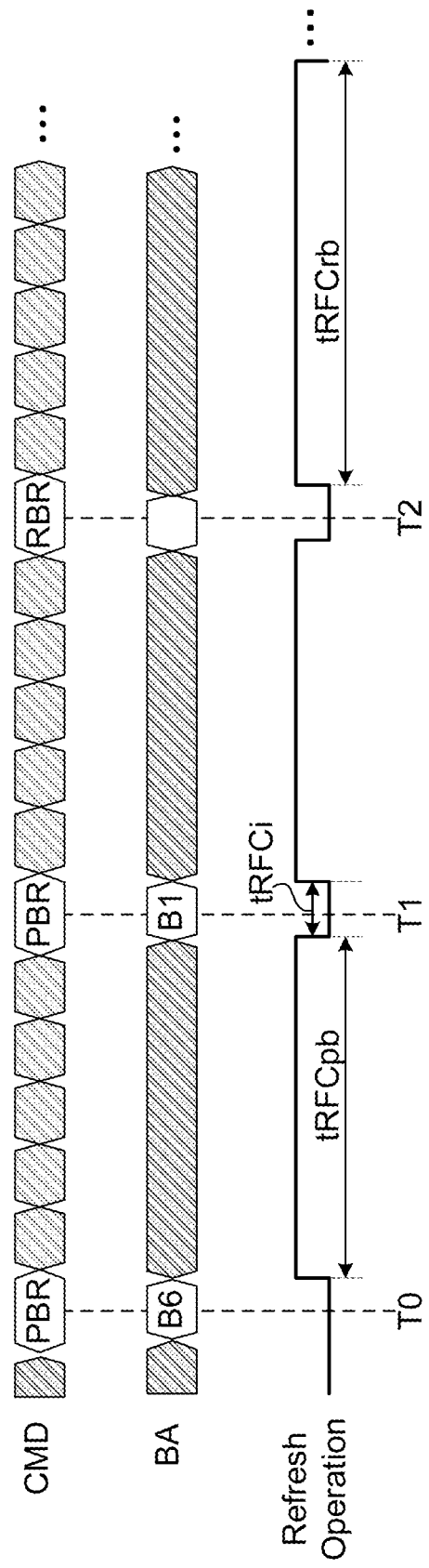
FIG. 7 is a timing diagram briefly illustrating an example of a per-bank refresh command PBR_CMD and a remaining bank refresh command RBR_CMD received by a memory device according to an example embodiment of the inventive concept.

FIG. 7 is a timing diagram briefly illustrating an example of a per-bank refresh command PBR_CMD and a remaining bank refresh command RBR_CMD received by a memory device according to embodiments of the inventive concept. Referring to FIG. 7, the memory device 1200 (see FIG. 4) may receive a per-bank refresh command PBR_CMD and a remaining bank refresh command RBR_CMD within a refresh cycle.

At time T0, the memory device 1200 receives a per-bank refresh command PBR_CMD from the memory controller 1100. The per-bank refresh command PBR_CMD may be received with a bank address BA to be refreshed. For example, the bank address BA indicating the sixth bank 'B6' may be input to the memory device 1200 together with the per-bank refresh command PBR_CMD. Then, in response to the per-bank refresh command PBR_CMD, the memory device 1200 performs a refresh operation on the corresponding cell-row of the selected sixth bank 'B6' for the per-bank refresh time tRFCpb.

At time T1, an additional per-bank refresh command PBR_CMD may be provided to the memory device 1200. In this case, the bank address BA indicating the first bank 'B1' may be input to the memory device 1200 together with the per-bank refresh command PBR_CMD. Then, the memory device 1200 will perform a per-bank refresh PBR operation on the first bank 'B1' after the refresh interval tRFCi.

At time T2, the remaining bank refresh command RBR_CMD is input by the memory controller 1100. When the remaining bank refresh command RBR_CMD is input, a separate bank address BA does not need to be input. This is because the refresh controller 1250 of the memory device 1200 can use the bank status (Bank_Status) of the remaining banks managed in the refresh status register 1290. The refresh controller 1250 may perform the remaining bank refresh RBR operation for refreshing all the remaining banks in parallel in response to the remaining bank refresh command RBR_CMD during the remaining bank refresh time tRFCrb. When the remaining bank refresh RBR operation is completed, the bank status (Bank_Status) of the refresh status register 1290 will be reset.

As described above, the memory controller 1100 may issue the remaining bank refresh command RBR_CMD, and the memory device 1200 may perform a remaining bank refresh RBR operation in response thereto. The number of refresh commands received by the memory device 1200 may be drastically reduced by using the remaining bank refresh command RBR_CMD. Therefore, the decrease in command bandwidth due to the refresh command can be reduced by the refresh method according to embodiments of the inventive concept.

Figure 8:
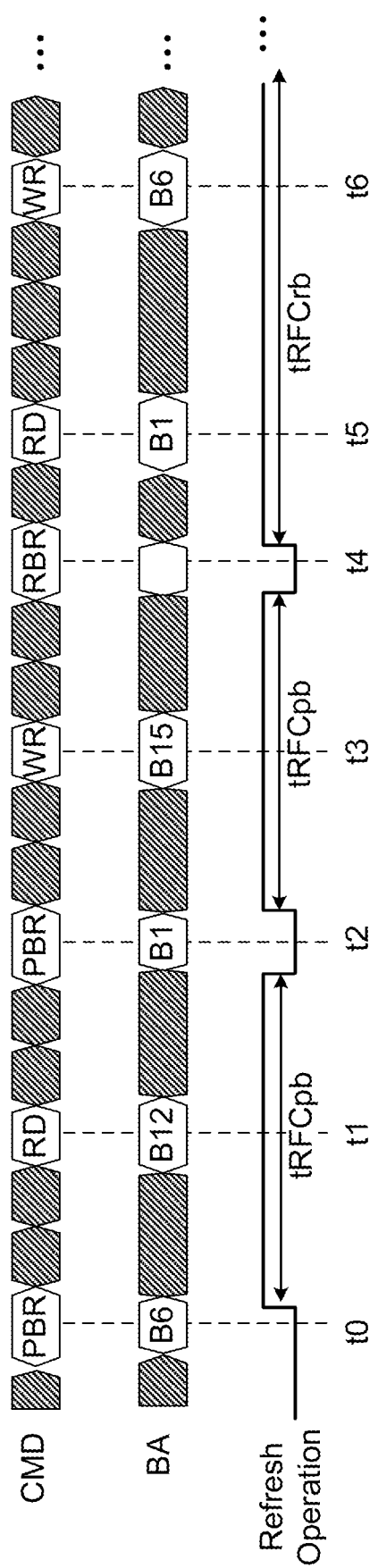
FIG. 8 is a timing diagram illustrating characteristics of a per-bank refresh PBR operation and a remaining bank refresh RBR operation according to an example embodiment of the inventive concept.

FIG. 8 is a timing diagram showing characteristics of a per-bank refresh PBR operation and a remaining bank refresh RBR operation according to embodiments of the inventive concept. Referring to FIG. 8, the memory device 1200 (see FIG. 4) may receive a read command RD and a write command WR during a per-bank refresh PBR operation or a remaining bank refresh RBR operation period.

At time t0, the memory device 1200 receives a per-bank refresh command PBR_CMD from the memory controller 1100. At this time, the memory device 1200 receives the bank address BA indicating the sixth bank 'B6' together with the per-bank refresh command PBR_CMD. Then, the memory device 1200 performs a refresh operation for the selected sixth bank 'B6' during the per-bank refresh time tRFCpb in response to the per-bank refresh command PBR_CMD.

At time t1, the memory device 1200 may receive a read command RD from the memory controller 1100. In this case, the bank address BA indicating the twelfth bank 'B12', which is not a target of the per-bank refresh PBR operation, may be input to the memory device 1200 together with the read command RD. That is, the memory device 1200 may receive a read or write command before the refresh operation for the sixth bank 'B6' is completed or before the per-bank refresh time tRFCpb elapses.

At time t2, an additional per-bank refresh command PBR_CMD may be provided to the memory device 1200. In this case, the bank address BA indicating the first bank 'B1' may be input to the memory device 1200 together with the per-bank refresh command PBR_CMD. The memory device 1200 may perform a per-bank refresh PBR operation on the first bank 'B1'.

At time t3, the memory device 1200 may receive a write command WR from the memory controller 1100. In this case, the bank address BA indicating the 15th bank 'B15', which is not the target of the per-bank refresh PBR operation, may be input to the memory device 1200 together with the write command WR. That is, the memory device 1200 may receive the write command WR before the refresh operation for the first bank 'B1' is completed or before the per-bank refresh time tRFCpb elapses.

At time t4, the remaining bank refresh command RBR_CMD may be input by the memory controller 1100. The refresh controller 1250 performs the remaining bank refresh RBR operation for refreshing in parallel the remaining banks for which the per-bank refresh PBR has not been performed in response to the remaining bank refresh command RBR_CMD during the remaining bank refresh time tRFCrb.

During the remaining bank refresh time tRFCrb, access to the memory banks 'B1' and 'B6' for which the per-bank refresh PBR has been completed is possible. That is, at time t5, the memory device 1200 may receive a read command RD for the first bank 'B1'. The memory device 1200 may perform a read operation of sensing the read-requested data of the first bank 'B1' and outputting the sensed data to the memory controller 1100. In addition, at time t6 before the remaining bank refresh time tRFCrb ends, the memory device 1200 may receive a write command WR for the sixth bank 'B6'.

As described above, the memory controller 1100 may control the refresh operation of the memory device 1200 using the per-bank refresh command PBR_CMD and the remaining bank refresh command RBR_CMD. In addition, read and write access to memory banks not designated for refresh is possible during the per-bank refresh PBR operation period and during the remaining bank refresh period RBR period. Therefore, if an urgent read or write command is executed in the per-bank refresh PBR operation period and the remaining bank refresh command RBR_CMD is used thereafter, the command bandwidth can be effectively used. In particular, as the number of memory banks increases, the effect of increasing the command bandwidth by use of the remaining bank refresh command RBR_CMD will increase.

Figure 9:
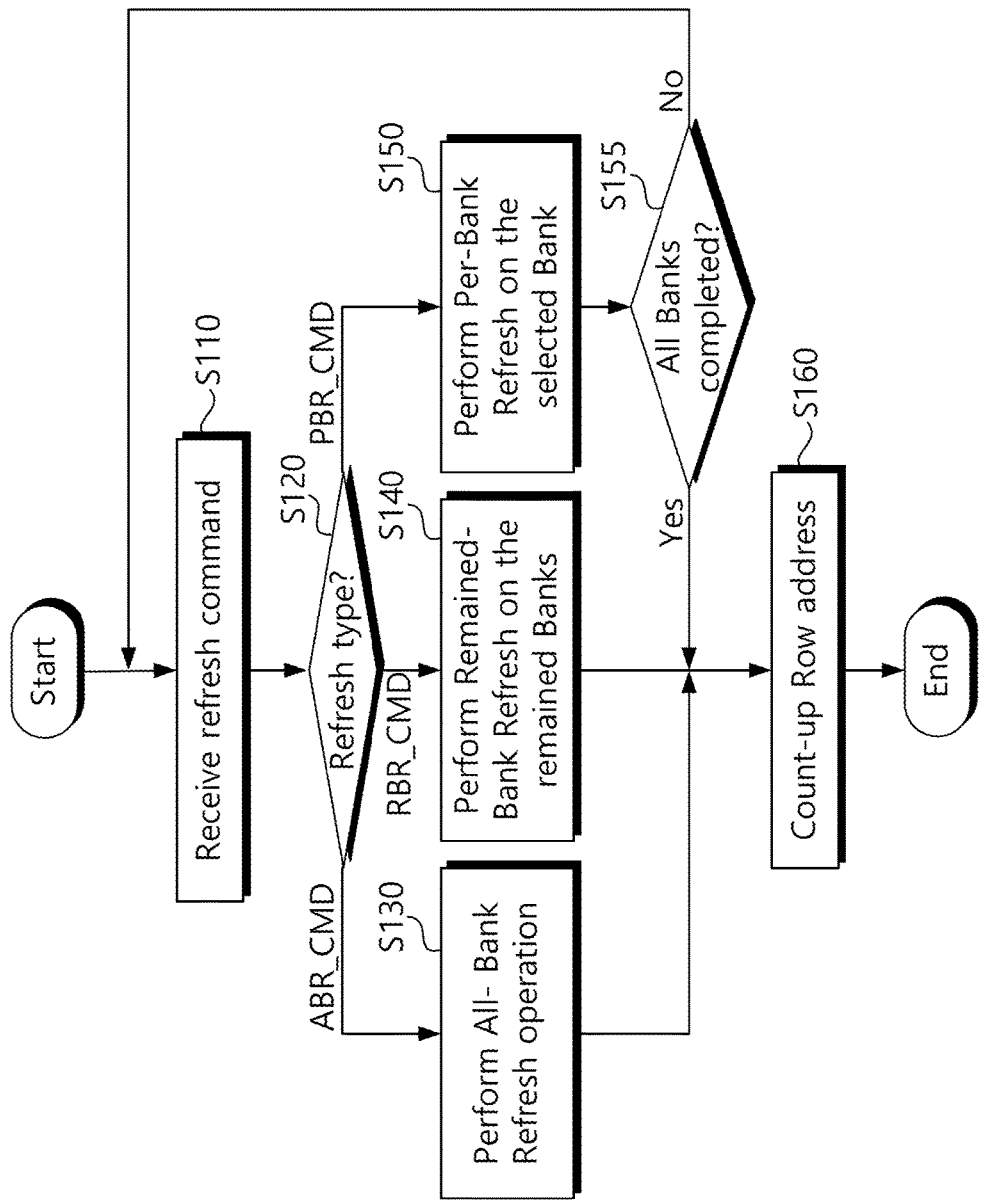
FIG. 9 is a flowchart illustrating a refresh method performed in a memory device according to an example embodiment of the inventive concept.

FIG. 9 is a flowchart illustrating a refresh method performed in a memory device according to an embodiment of the inventive concept. Referring to FIG. 9, the memory device 1200 may reduce the number of times the refresh command is issued by using the per-bank refresh command PBR_CMD and the remaining bank refresh command RBR_CMD.

In block S110, the memory device 1200 receives a refresh command from the memory controller 1100. Here, the refresh command is limited to an all-bank refresh command ABR_CMD, a per-bank refresh command PBR_CMD, and a remaining bank refresh command RBR_CMD to describe example embodiments of the inventive concept.

In block S120, the refresh controller 1250 (see FIG. 4) of the memory device 1200 performs operation branching according to the type of the refresh command. If the received refresh command is the all-bank refresh command ABR_CMD, the procedure moves to block S130. If the received refresh command is the remaining bank refresh command RBR_CMD, the procedure moves to block S140. And, if the received refresh command is a per-bank refresh command PBR_CMD, the procedure will move to block S150.

In block S130, the refresh controller 1250 performs an all-bank refresh operation in response to the all-bank refresh command ABR_CMD. That is, the refresh controller 1250 refreshes in parallel the selected cell-rows of all memory banks. A read or write command cannot be input in the period tRFCab in which the all-bank refresh operation is performed. When the all-bank refresh operation is completed, the process moves to block S160 and the selected cell-row is counted up or incremented.

In block S140, the refresh controller 1250 performs a remaining bank refresh operation in response to the remaining bank refresh command RBR_CMD. The refresh controller 1250 refreshes in parallel the cell-rows of the remaining banks that are not processed by the per-bank refresh operation in the current refresh cycle. During the period tRFCrb in which the remaining bank refresh operation is performed, a read or write operation to the memory bank for which the per-bank refresh is completed is possible. That is, although limited, access to the memory device 1200 is possible. When the remaining bank refresh RBR operation is completed, the procedure moves to block S160. And the selected cell-row is counted up.

In block S150, the refresh controller 1250 performs a per-bank refresh operation on the selected memory bank in response to the per-bank refresh command PBR_CMD. The memory device 1200 receives the bank address BA to which the per-bank refresh is applied together with the per-bank refresh command PBR_CMD. Also, during the period tRFCpb in which the per-bank refresh operation is performed, a read or write operation to a memory bank other than a bank selected by the bank address BA is possible.

In block S155, it is determined whether all banks to be refreshed in the corresponding refresh cycle have been refreshed. That is, it is determined whether the refresh of all memory banks has been completed by the per-bank refresh operation performed in block S150. If it is determined that the refresh of all memory banks is completed by the per-bank refresh in step S150 (Yes direction), the procedure moves to block S160, and the selected cell-row is counted up. On the other hand, if it is determined that the refresh of all memory banks is not completed despite progress in block S150 (No direction), the process moves to block S110, and an additional refresh command is received.

In the above, the per-bank refresh PBR operation and the remaining bank refresh RBR operation procedure of the memory device 1200 according to embodiments of the inventive concept have been illustratively described. Through the remaining bank refresh RBR operation performed by the remaining bank refresh command RBR_CMD, the memory device 1200 may significantly reduce the number of times the refresh command is received.

Figure 10:
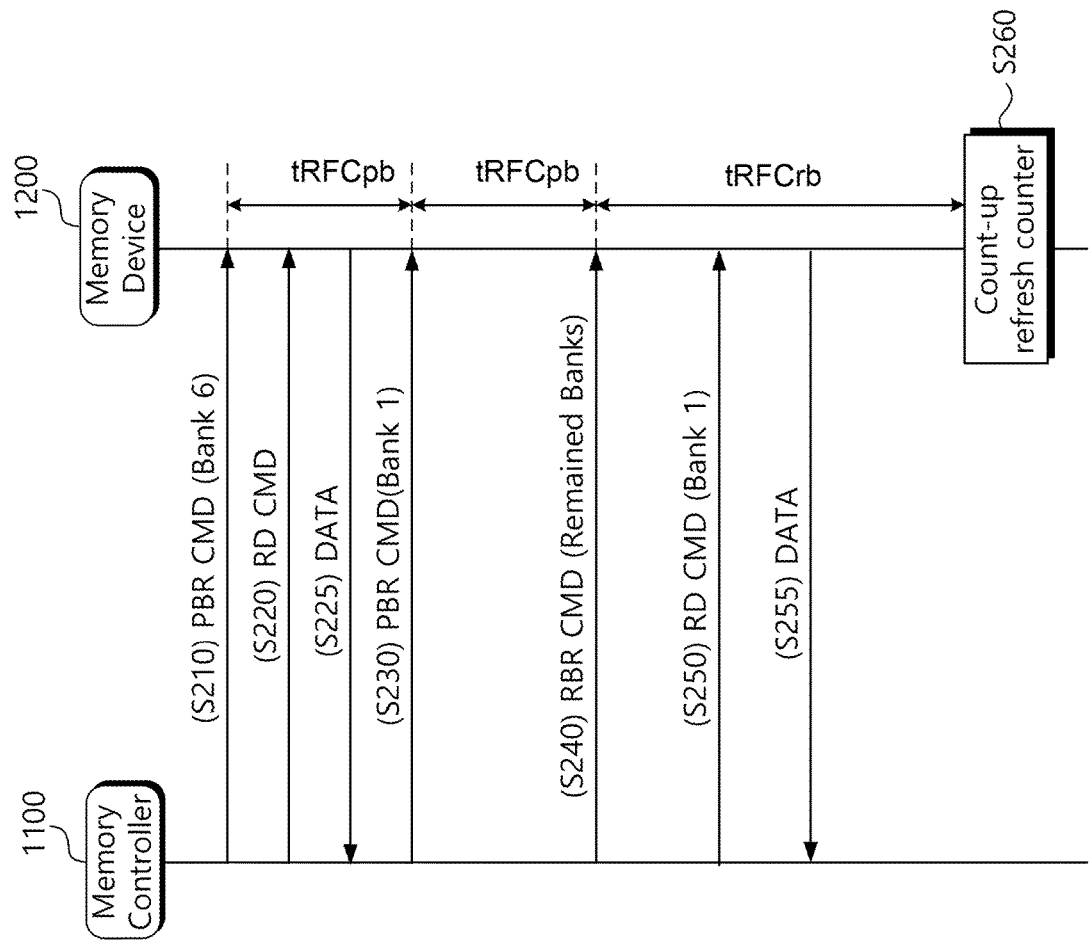
FIG. 10 is a diagram illustrating mutual operations of memory systems using a remaining bank refresh command RBR_CMD.

FIG. 10 is a diagram illustrating examples of mutual operations of memory systems using a remaining bank refresh command RBR_CMD according to embodiments of the inventive concept. Referring to FIG. 10, the memory controller 1100 may provide a read or write command to the memory device 1200 during a per-bank refresh or remaining bank refresh operation.

In operation S210, the memory controller 1100 transmits a per-bank refresh command PBR_CMD for the sixth bank 'Bank 6' to the memory device 1200. Then, in response to the per-bank refresh command PBR_CMD, the memory device 1200 performs a refresh operation on the corresponding cell-row of the sixth bank 'Bank 6' for the per-bank refresh time tRFCpb.

In operation S220, before the refresh operation for the sixth bank 'Bank 6' is completed or before the per-bank refresh time tRFCpb elapses, the memory controller 1100 issues a read command 'RD CMD' to the memory device 1200. The sixth bank 'Bank 6' in which the per-bank refresh PBR is in progress must be excluded from the read address provided together with the read command 'RD CMD'. In operation S225, the memory device 1200 may transmit the read data to the memory controller 1100 even before the per-bank refresh time tRFCpb ends.

In operation S230, the memory controller 1100 transmits the per-bank refresh command PBR_CMD for the first bank 'Bank 1' to the memory device 1200. Then, the memory device 1200 will perform a refresh operation on the first bank 'Bank 1' during the per-bank refresh time tRFCpb in response to the per-bank refresh command PBR_CMD. During the per-bank refresh time tRFCpb corresponding to the first bank 'Bank 1', the memory controller 1100 may transmit a read or write command for a bank other than the first bank 'Bank 1'.

In operation S240, the memory controller 1100 transmits a remaining bank refresh command 'RBR_CMD' to the memory device 1200. Then, the memory device 1200 performs a refresh operation on the remaining banks during the remaining bank refresh time tRFCrb in response to the remaining bank refresh command RBR_CMD. During the remaining bank refresh time tRFCrb, access to the memory banks 'Bank 1' and 'Bank 6' for which the per-bank refresh PBR has been completed is possible.

In operation S250, the memory controller 1100 may transmit a read command 'RD CMD' for the first bank 'Bank 1' to the memory device 1200. Then, the memory device 1200 senses the data of the first bank 'Bank 1' requested to read. In operation S255, the memory device 1200 transfers the read data to the memory controller 1100.

In operation S260, the memory device 1200 counts up the selected cell-row as the refresh of the remaining memory banks is completed. That is, when the remaining bank refresh time tRFCrb elapses, the memory device 1200 terminates the refresh cycle for the selected cell-row and increases the refresh count to move to the next refresh cycle.

As described above, the memory controller 1100 may control the refresh operation of the memory device 1200 using the remaining bank refresh command RBR_CMD. In addition, read and write access may be possible to memory banks that are not designated for refresh during the per-bank refresh PBR operation period and during the remaining bank refresh period RBR period. Therefore, if an urgent read or write command needs to be executed in the per-bank refresh PBR operation period and the remaining bank refresh command RBR_CMD is used thereafter, the command bandwidth can be effectively used.

Figure 11:
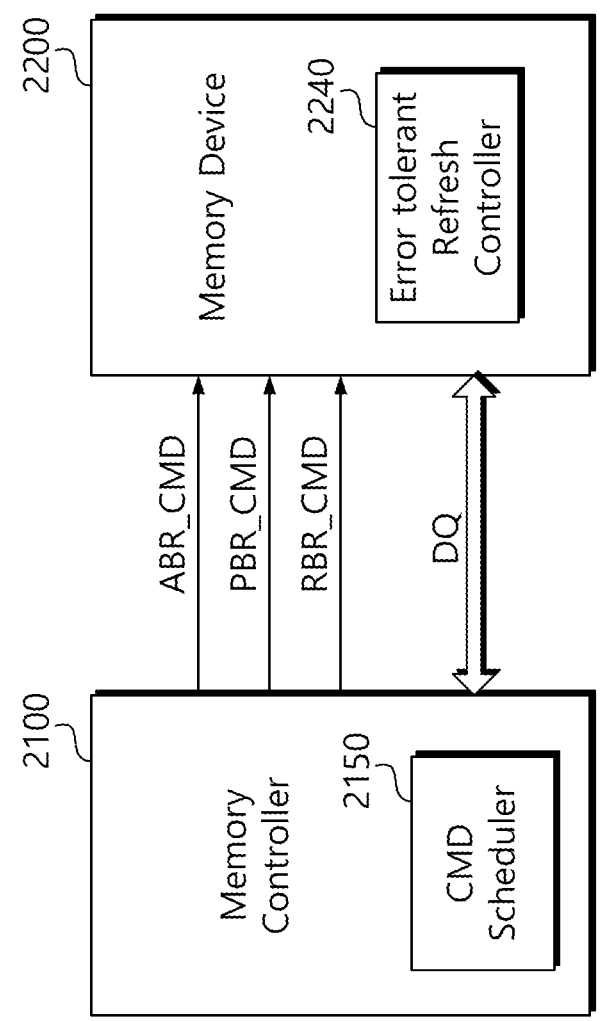
FIG. 11 is a block diagram illustrating a memory system according to another example embodiment of the inventive concept.

FIG. 11 is a block diagram illustrating a memory system according to another example embodiment of the inventive concept. Referring to FIG. 11, a memory system 2000 according to embodiments of the inventive concept may include a memory controller 2100 and a memory device 2200. Here, the memory controller 2100 is substantially the same as the memory controller 1100 of FIG. 1. Therefore, a description of the memory controller 2100 will be omitted.

The memory device 2200 outputs read data requested by the memory controller 2100 to the memory controller 2100 or stores write-requested data by the memory controller 2100 in a memory cell. The memory device 2200 of embodiments of the inventive concept may perform a remaining bank refresh RBR operation in response to the remaining bank refresh command RBR_CMD. When the remaining bank refresh command RBR_CMD is provided while performing the per-bank refresh PBR in one refresh cycle, the memory device 2200 may perform a simultaneous or parallel refresh operation on the remaining memory banks.

In particular, the memory device 2200 according to embodiments of the inventive concept includes an error tolerant refresh controller 2240. If an all-bank refresh command ABR_CMD is provided at the time when the remaining bank refresh command RBR_CMD is expected to be provided, the error tolerant refresh controller 2240 may recognize it as the remaining bank refresh command RBR_CMD.

That is, the all-bank refresh command ABR_CMD may be provided due to an error of the memory controller 2100 after performing the per-bank refresh PBR operation in a refresh cycle currently in progress. In this case, the error tolerant refresh controller 2240 may recognize the all-bank refresh command ABR_CMD as the remaining bank refresh command RBR_CMD and perform a simultaneous and/or parallel refresh operation on the remaining memory banks. When the remaining bank refresh RBR operation is completed, the count value of the cell-row selected for refresh will be counted up.

Figure 12:
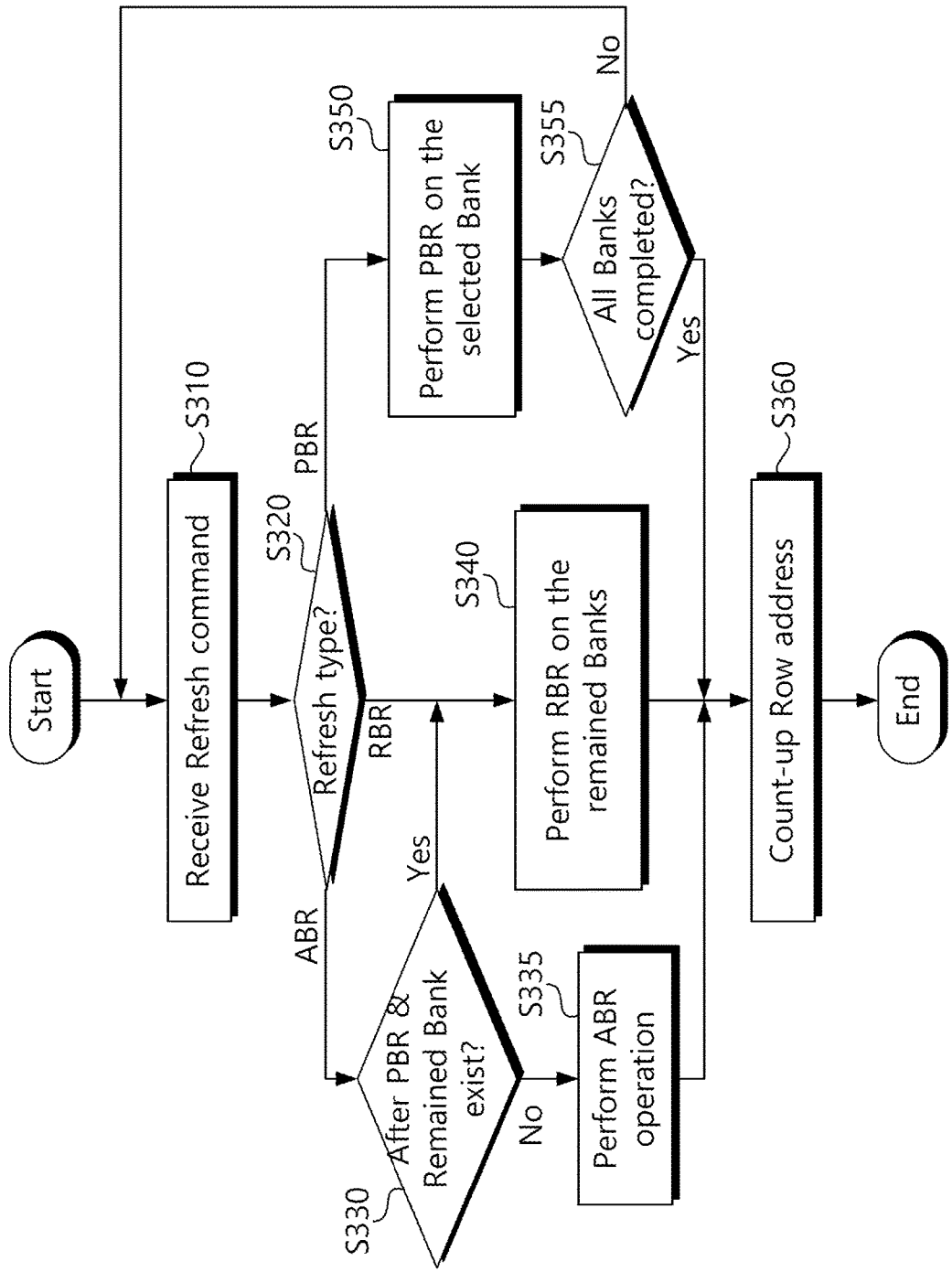
FIG. 12 is a flowchart illustrating a tolerance function for a refresh command error performed in the memory device of FIG. 11.

FIG. 12 is a flowchart illustrating a tolerance function for a refresh command error performed in the memory device of FIG. 11. Referring to FIG. 12, the memory device 2200 may interpret an all-bank refresh command ABR_CMD following the per-bank refresh command PBR_CMD as a remaining bank refresh command RBR_CMD.

In block S310, the memory device 2200 receives a refresh command from the memory controller 2100. Here, the refresh command may be any one of an all-bank refresh command ABR_CMD, a per-bank refresh command PBR_CMD, and a remaining bank refresh command RBR_CMD to describe example embodiments of the inventive concept.

In block S320, the memory device 2200 performs operation branching according to the type of the refresh command. If the received refresh command is an all-bank refresh command ABR_CMD, the procedure moves to block S330. If the received refresh command is the remaining bank refresh command RBR_CMD, the procedure moves to block S340. And, if the received refresh command is a per-bank refresh command PBR_CMD, the procedure will move to block S350.

In block S330, the memory device 2200 performs an operation branch according to the timing at which the all-bank refresh command ABR_CMD is received. If it is determined that the all-bank refresh command ABR_CMD is issued when there are remaining banks after the per-bank refresh PBR operation within the refresh cycle (Yes direction), the procedure moves to block S340. On the other hand, if it is determined that the all-bank refresh command ABR_CMD is issued when the remaining bank(s) do not exist (No direction), the procedure moves to block S335.

In block S335, the error tolerant refresh controller 2240 (see FIG. 11) of the memory device 2200 determines that the all-bank refresh command ABR_CMD is not an error. Accordingly, the memory device 2200 will perform an all-bank refresh operation. The memory device 2200 will simultaneously and/or in parallel refresh the selected cell-rows of all memory banks. Thereafter, the procedure moves to block S360, and the selected cell-row is counted up.

In block S340, the memory device 2200 performs the remaining bank refresh operation in response to the all-bank refresh command ABR_CMD or the remaining bank refresh command RBR_CMD. That is, the memory device 2200 simultaneously and/or in parallel refreshes the cell-rows of all the remaining banks that have not been processed by the per-bank refresh operation in the current refresh cycle. When the remaining bank refresh operation is completed, the procedure moves to block S360, and the selected cell-row is counted up.

In block S350, the memory device 2200 performs the per-bank refresh operation on the selected memory bank in response to the per-bank refresh command PBR_CMD.

In block S355, the memory device 2200 determines whether all banks to be refreshed in the corresponding refresh cycle have been refreshed. That is, it is determined whether the refresh of all memory banks has been completed by the per-bank refresh operation performed in block S350. If it is determined that the refresh of all memory banks is completed by the per-bank refresh in block S350 (Yes direction), the procedure moves to block S360. On the other hand, if it is determined that the refresh of all memory banks is not completed despite progress in block S350 (No direction), the procedure moves to block S310 and an additional refresh command is received.

Figure 13:
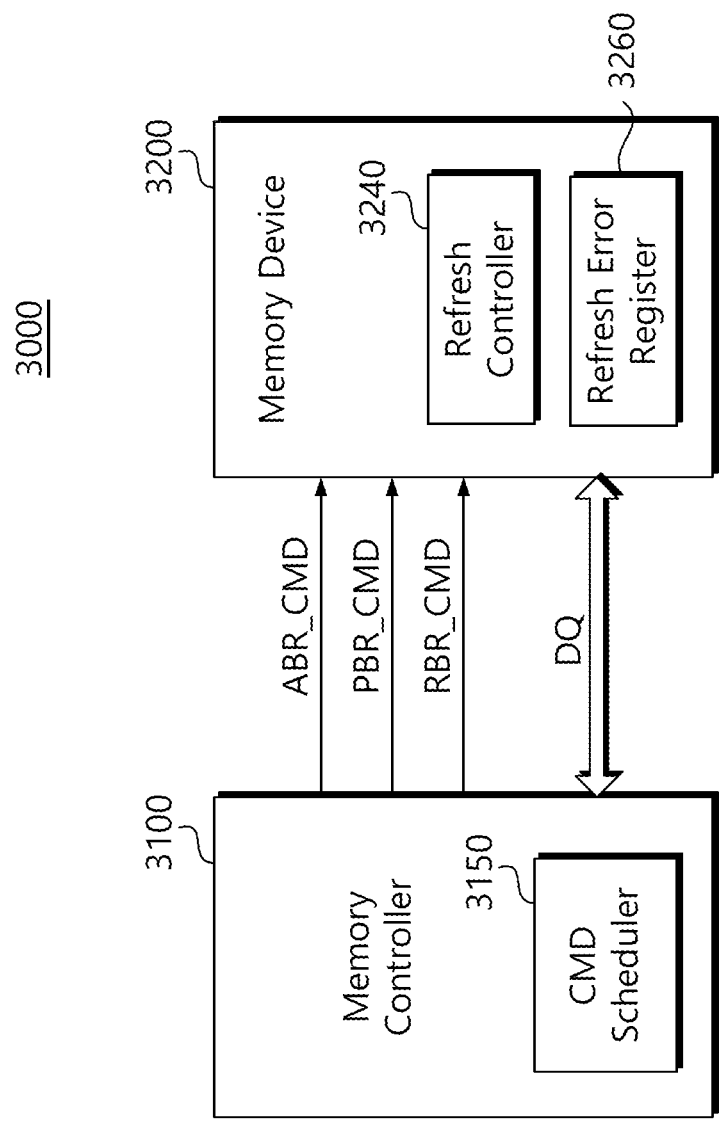
FIG. 13 is a block diagram illustrating a memory system according to still another embodiment of the inventive concept.

FIG. 13 is a block diagram illustrating a memory system according to still another embodiment of the inventive concept. Referring to FIG. 13, a memory system 3000 according to embodiments of the inventive concept may include a memory device 3200 including a memory controller 3100 and a refresh error register 3260. Here, the memory controller 3100 is substantially the same as the memory controller 1100 of FIG. 1. Accordingly, a description of the memory controller 3100 will be omitted.

The memory device 2200 is configured to perform a refresh operation on memory banks in response to refresh commands ABR_CMD, PBR_CMD, and RBR_CMD. In particular, the memory device 3200 may be configured to perform a remaining bank refresh RBR operation in response to the remaining bank refresh command RBR_CMD. When the remaining bank refresh command RBR_CMD is provided while performing the per-bank refresh PBR in one refresh cycle, the memory device 3200 may be configured to perform a simultaneous and/or parallel refresh operation on the remaining memory banks. For such a refresh operation, the memory device 3200 may include a refresh controller 3240.

In particular, the memory device 3200 according to embodiments of the inventive concept may include a refresh error register 3260. Error information of the refresh command may be stored in the refresh error register 3260. For example, before the refresh cycle is completed, if a refresh command for a memory bank that has already been refreshed by the per-bank refresh command PBR_CMD is issued twice, this error information is stored in the refresh error register 3260. Further, such refresh error information may be output later in response to a request of a host, such as a debugging device or a test device.

As described above, the memory device 3200 according to embodiments of the inventive concept may be configured to store command errors of the memory controller 3100 through the refresh error register 3260. And the stored error information can be used for debugging or testing.

Figure 14:
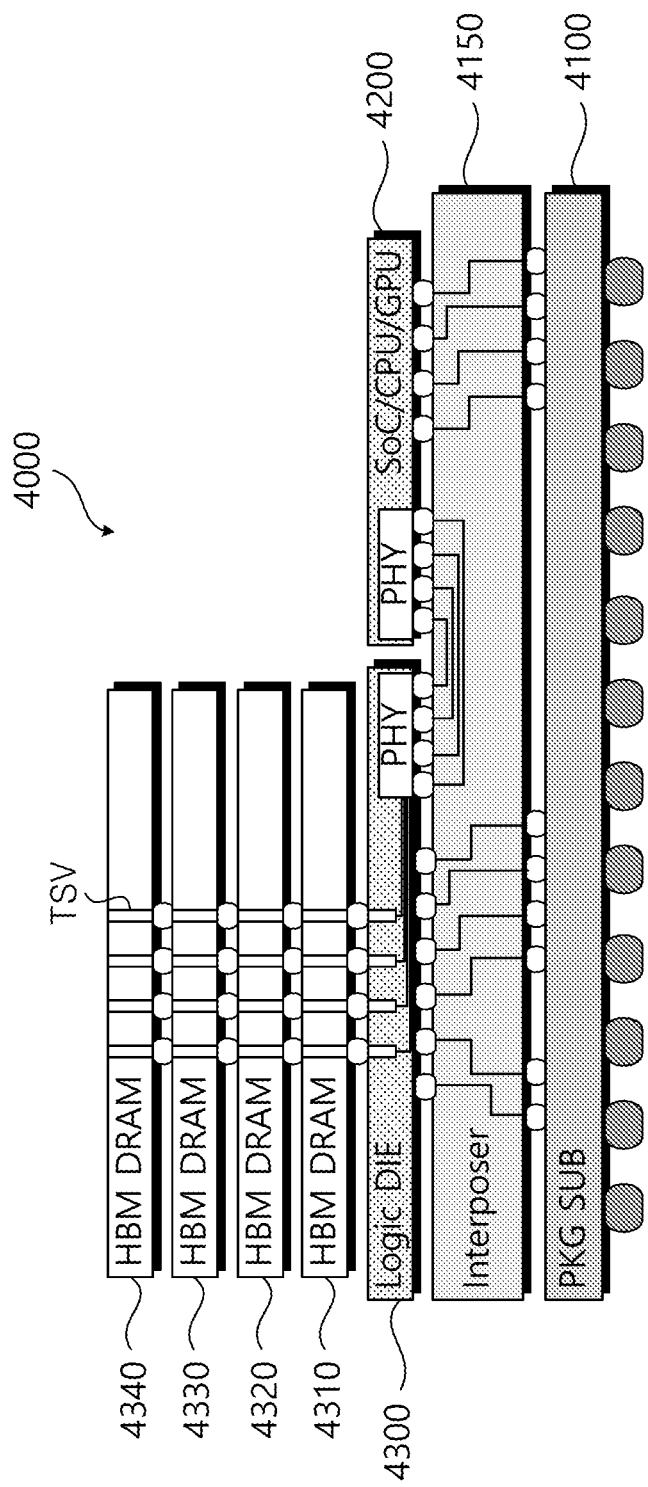
FIG. 14 is a cross-sectional view showing a memory system according to an example embodiment of the inventive concept.

FIG. 14 is a cross-sectional view illustrating a memory system according to an example embodiment of the inventive concept. Referring to FIG. 14, a memory system 4000 may be implemented as a stacked memory, which includes a PCB substrate 4100, an interposer 4150, a host die 4200, a logic die 4300, and HBMs 4310, 4320, 4330, 4340.

The memory system 4000 connects the HBMs 4310, 4320, 4330, and 4340 and the host die 4200 using an interposer 4150. The interposer 4150 is disposed on the PCB 4100 and is electrically connected to the PCB 4100 through flip chip bumps FB.

A host die 4200, a logic die 4300, and stacked HBMs 4310, 4320, 4330, and 4340 may be disposed on the interposer 4150. TSV lines are formed in the plurality of HBMs 4310, 4320, 4330, and 4340 to implement a memory system. The TSV lines may be electrically connected to micro bumps MB formed between the plurality of HBMs 4310, 4320, 4330, and 4340.

Here, the plurality of HBMs 4310, 4320, 4330, and 4340 may be configured to perform a refresh operation in response to the per-bank refresh command PBR_CMD and the remaining bank refresh command RBR_CMD, respectively, according to an embodiment of the inventive concept. Based on this feature, the number of times refresh commands for the plurality of HBMs 4310, 4320, 4330, and 4340 are issued may be reduced. Therefore, even in a memory system, such as a high-bandwidth memory HBM or a system-in-package (SiP), bandwidth reduction of a command channel due to a refresh operation can be reduced or minimized.

The above are specific embodiments for carrying out embodiments of the inventive concept. In addition to the above-described embodiments, embodiments of the inventive concept may include simple design changes or easily changeable implementations. In addition, the inventive concept will include techniques that can be easily modified and implemented using the embodiments. Therefore, the scope of the present disclosure should not be limited to the above-described embodiments, and should be defined by the claims and equivalents of the claims set forth hereafter.

What is claimed is:

1. A semiconductor memory device, comprising:
   a memory cell array including a plurality of memory banks;
   a command decoder configured to decode a per-bank refresh command and a remaining bank refresh command;
   a refresh controller configured to:
      perform a per-bank refresh operation for refreshing at least one memory bank among the plurality of memory banks based on a decoding result of the per-bank refresh command of the command decoder; and
      perform a remaining bank refresh operation for refreshing remaining memory banks other than the at least one memory bank among the plurality of memory banks, in response to the remaining bank refresh command during one refresh cycle; and
   a refresh status register configured to update whether each of the plurality of memory banks has been refreshed during the one refresh cycle.

2. The device of claim 1, wherein a read or write operation is performed on memory banks other than the at least one memory bank among the plurality of memory banks during the per-bank refresh operation, and
   wherein the remaining bank refresh command is received after the per-bank refresh operation.

3. The device of claim 1, wherein reading or writing of the at least one memory bank among the plurality of memory banks refreshed by the per-bank refresh operation is performed during the remaining bank refresh operation.

4. The device of claim 1, wherein the at least one memory bank includes a first memory bank that is refreshed first and a second memory bank that is refreshed subsequently, wherein bank addresses of the first memory bank and the second memory bank are non-sequential.

5. The device of claim 1, wherein the refresh controller is configured to reset the status register after the remaining bank refresh operation is performed.

6. The device of claim 5, wherein the refresh controller includes a refresh counter configured to count up a row address for refresh in accordance with the reset of the refresh status register.

7. The device of claim 1, further comprising:
   an address decoder configured to receive a bank address input in synchronization with the per-bank refresh command.

8. The device of claim 1, wherein the refresh controller is configured to perform the remaining bank refresh operation in response to an all-bank refresh command received at a time when the remaining memory banks exist after executing the per-bank refresh command.

9. The device of claim 1, further comprising:
   a refresh error register configured store an error information of additional per-bank refresh command for the at least one memory bank that has been refreshed by the per-bank refresh operation.

10. A refresh method of a semiconductor memory device including a plurality of memory banks:
    refreshing at least one of the plurality of memory banks in response to a per-bank refresh command;
    storing a state of the refreshed at least one of the plurality of memory banks;
    scheduling a remaining bank refresh operation based on the state of the refreshed at least one of the plurality of memory banks corresponding to the per-bank refresh command during one refresh cycle; and
    refreshing in parallel remaining memory banks among the plurality of memory banks other than the at least one of the plurality of memory banks.

11. The method of claim 10, wherein the at least one of the plurality memory banks includes a first memory bank that is refreshed first and a second memory bank that is refreshed subsequently, wherein bank addresses of the first memory bank and the second memory bank are non-sequential.

12. The method of claim 10, wherein the refreshing the one of the plurality of memory banks comprises:
    performing a read or a write operation on memory banks other than the one of the plurality of memory banks.

13. The method of claim 10, wherein the refreshing in parallel remaining memory banks comprises:
    performing a read or a write operation on any one of the plurality of memory banks.

14. The method of claim 10, further comprising:
    counting up a refresh count of a row address after the remaining memory banks are refreshed in parallel.

15. The method of claim 14, further comprising:
    resetting a refresh status register for monitoring a refresh status of each of the plurality of memory banks after the remaining memory banks are refreshed in parallel.

16. A semiconductor device comprising:
    a plurality of memory banks;
    a command decoder configured to decode an all-bank refresh command, a per-bank refresh command, and a remaining bank refresh command;
    an address decoder configured to receive an input address;
    a refresh controller configured to:
       perform a per-bank refresh operation for refreshing one memory bank among the plurality of memory banks in response to the per-bank refresh command during one refresh cycle, and
       perform a remaining bank refresh operation for refreshing in parallel remaining memory banks remaining after the per-bank refresh operation among the plurality of memory banks in response to the remaining bank refresh command; and
    a refresh status register configured to update a refresh status of each of the plurality of memory banks during the one refresh cycle.

17. The device of claim 16, wherein reading or writing of the one memory bank refreshed by the per-bank refresh operation is performed during the remaining bank refresh operation.

18. The device of claim 16, wherein when the remaining bank refresh operation is completed, the refresh status register is reset.

19. The device of claim 18, wherein the refresh controller includes a refresh counter configured to count up a refresh row address in synchronization with the reset of the refresh status register.

20. The device of claim 18, wherein the refresh controller is configured to perform the remaining bank refresh operation in response to the all-bank refresh command received after execution of the per-bank refresh command.

* * * * *